United States Patent
Ryu et al.

(10) Patent No.: US 8,530,749 B2
(45) Date of Patent: Sep. 10, 2013

(54) COPPER FOIL ATTACHED TO THE CARRIER FOIL, A METHOD FOR PREPARING THE SAME AND PRINTED CIRCUIT BOARD USING THE SAME

(75) Inventors: Jong Ho Ryu, Daejeon (KR); Chang Yol Yang, Gwangju (KR); Joung Ah Kang, Chungcheongnam-Do (KR)

(73) Assignee: Iljin Copper Foil Co., Ltd., Jeollabuk-do (KR)

( * ) Notice: Subject to any disclaimer, the term of this patent is extended or adjusted under 35 U.S.C. 154(b) by 385 days.

(21) Appl. No.: 12/810,511

(22) PCT Filed: Dec. 23, 2008

(86) PCT No.: PCT/KR2008/007600
§ 371 (c)(1), (2), (4) Date: Jun. 24, 2010

(87) PCT Pub. No.: WO2009/084839
PCT Pub. Date: Jul. 9, 2009

(65) Prior Publication Data
US 2010/0282500 A1    Nov. 11, 2010

(30) Foreign Application Priority Data
Dec. 28, 2007    (KR) .................. 10-2007-0140522

(51) Int. Cl.
*H05K 1/03* (2006.01)
*H05K 1/09* (2006.01)

(52) U.S. Cl.
USPC .......................................... 174/256; 174/257

(58) Field of Classification Search
USPC ................................. 174/256–259
See application file for complete search history.

(56) References Cited

U.S. PATENT DOCUMENTS

2010/0270063 A1* 10/2010 Suzuki et al. ............... 174/257

FOREIGN PATENT DOCUMENTS

| CN | 1984527 A | 6/2007 |
|---|---|---|
| JP | 2002-368365 A | 12/2002 |
| JP | 2004-031375 A | 1/2004 |
| JP | 2004-161840 A | 6/2004 |
| JP | 2004-169181 A | 6/2004 |
| JP | 2005-254673 A | 9/2005 |
| JP | 2005-260058 A | 9/2005 |
| JP | 2006-0224406 A | 1/2006 |
| JP | 2006-312265 A | 11/2006 |
| JP | 2007-186781 A | 7/2007 |
| KR | 1020050025277 A | 3/2005 |
| KR | 2007-0064282 | 6/2007 |
| KR | 2007-0064283 | 6/2007 |

OTHER PUBLICATIONS

Chinese First Office Action; dated Sep. 21, 2012; Application No. 200880123120.3.

* cited by examiner

*Primary Examiner* — Jeremy Norris
(74) *Attorney, Agent, or Firm* — Ladas & Parry LLP

(57) ABSTRACT

Provided is an ultra-thin copper foil to which a carrier foil is attached, including: a carrier foil, a peeling layer, and an ultra-thin copper foil, wherein the peeling layer includes a first metal A having peelability, a second metal B and a third metal C facilitating coating of the first metal, wherein the amount (a) of the first metal A is in a range of about 30 to about 89% by total weight of the peeling layer, the amount (b) of the second metal B is in a range of about 10 to about 60% by total weight of the peeling layer, and the amount (c) of the third metal C is in a range of about 1 to about 20% by total weight of the peeling layer.

7 Claims, No Drawings

COPPER FOIL ATTACHED TO THE CARRIER FOIL, A METHOD FOR PREPARING THE SAME AND PRINTED CIRCUIT BOARD USING THE SAME

TECHNICAL FIELD

The present invention relates to an ultra-thin copper foil to which a carrier foil is attached, a method of preparing the same, and a printed circuit board using the same, and more particularly, to an ultra-thin copper foil to which a carrier foil is attached, including a carrier foil, a peeling layer, and an ultra-thin copper foil, a method of preparing the same, and a printed circuit board using the same.

BACKGROUND ART

Copper foil used in printed circuit boards is thermally pressed on a resin board. A surface of the thermally pressed copper foil may or may not be roughened. The roughened surface of the copper foil may increase bonding strength between the resin board and the copper foil. If the surface of the copper foil is not roughened, the bonding strength may be increased using an adhesive or a silane coupling agent. As a result, the printed circuit board may have high reliability.

As electronic components are highly integrated, miniaturized, and made lightweight, wiring patterns of printed circuit boards become finer. When a thick copper foil is used to prepare a printed circuit board having fine patterns, the time taken to etch the printed circuit board for forming the wiring patterns is increased. Thus, verticality of sidewalls of the wiring patterns formed by etching may be reduced. In particular, if a wiring pattern formed by etching has a narrow line width, the wiring pattern may be discontinuous. Thus, the thickness of the copper foil used for fine patterns may be equal to or less than 9 µm. In general, a copper foil having a thickness of 12 µm is thermally pressed and half etched to be used for fine patterns. In order to reduce the loss of copper foil in a process such as etching, the copper foil may be formed to be ultra thin. The thickness of the ultra-thin copper foil, which is not attached to a carrier, is about 9 µm.

However, since the ultra-thinned copper foil (hereinafter, ultra-thin copper foil layer) has weak mechanical strength, it may be wrinkled or broken during the preparation of a printed circuit board. In addition, the ultra-thin copper foil may be cut. Accordingly, an ultra-thin copper foil to which a carrier foil is attached may be used for micro patterning. The ultra-thin copper foil to which a carrier foil is attached may be prepared by electrically depositing an ultra-thin copper foil on a surface of a metal foil functioning as a carrier (hereinafter, carrier foil) using a peeling layer.

That is, in the ultra-thin copper foil to which a carrier foil is attached, the peeling layer is formed on a surface of the carrier foil and the ultra-thin copper foil is formed thereon using electroplating. In general, the outermost surface of the ultra-thin copper foil formed by electroplating is roughened.

The peeling layer formed on a surface of the carrier foil is formed of an organic material, Cr, a Cr alloy, a Ni alloy, or the like. The peeling layer is disclosed in Japanese Patent Publication Nos. 2002-368365, 2004-031375, 2004-169181, 2004-161840, 2005-254673, 2005-260058, 2006-022406, and 2006-312265.

The peeling layer may be a metal layer formed by metal plating or an oxide film which is formed by metal plating followed by anodic oxidation, and then it is peeled off from the ultra thin copper foil. The peeling layer has good peelability at room temperature but non-uniform peelability at high temperature.

In a printed circuit board, a high temperature resistant resin, such as, polyimide, is used as an insulating board. Thus, pressing processes between the ultra-thin copper foil and an insulating board and/or curing processes of the printed circuit board should be performed at high temperature, and an organic peeling layer attached to the ultra-thin copper foil is not easily peeled off. Thus, a metallic peeling layer instead of an organic peeling layer is used. In this regard, the metallic peeling layer may be formed of Cr, a Cr alloy, or the like. For example, Korean Patent Publication No. 2005-0025277 discloses a method of forming a peeling layer using Cr. However, the use of Cr is limited according to the Restriction of Hazardous Substances Directive (Rohs), and stability of printed circuit boards using such metallic peeling layers is reduced due to blisters occurring during the preparation process of the printed circuit boards and a variation of peelability.

Thus, there is a need to develop a peeling layer without using Cr, wherein, when the peeling layer is used in the preparation of printed circuit boards, blister does not occur.

DETAILED DESCRIPTION OF THE INVENTION

Technical Problem

The present invention provides an ultra-thin copper foil to which a carrier foil is attached, including a carrier foil, a peeling layer, and an ultra-thin copper foil, wherein the peeling layer is easily peeled off even at high temperature without blister occurring and not using a hazardous material such as Cr, a method of preparing the same, and a printed circuit board using the same.

Technical Solution

According to an aspect of the present invention, there is provided an ultra-thin copper foil to which a carrier foil is attached, including: a carrier foil, a peeling layer, and an ultra-thin copper foil, wherein the peeling layer includes a first metal A having peelability, a second metal B and a third metal C facilitating coating of the first metal, wherein the amount (a) of the first metal A is in a range of about 30 to about 89% by total weight of the peeling layer, the amount (b) of the second metal B is in a range of about 10 to about 60% by total weight of the peeling layer, and the amount (c) of the third metal C is in a range of about 1 to about 20% by total weight of the peeling layer.

According to another aspect of the present invention, there is provided a printed circuit board prepared by stacking the ultra-thin copper foil to which a carrier foil is attached on the printed circuit board, wherein the ultra-thin copper foil faces the printed circuit board.

According to another aspect of the present invention, there is provided a method of preparing the ultra-thin copper foil to which a carrier foil is attached, the method including: forming a peeling layer on a smooth surface of a carrier copper foil in a plating bath having a pH equal to or greater than 9.5 and including a first metal, a second metal, a third metal, a metal salt of citric acid, and ammonia water or an ammonium salt.

Advantageous Effects

According to the present invention, an ultra-thin copper foil comprises a peeling layer that does not cause an occurrence of blister during the high temperature preparation process of the PCB, in which high temperature-resistant resin is used. Thus, an ultra-thin copper film can be easily peeled off from the carrier foil.

BEST MODE

Hereinafter, an ultra-thin copper foil to which a carrier foil is attached, a method of preparing the same, and a printed circuit board using the same according to embodiments of the present invention will be described in more detail.

An ultra-thin copper foil to which a carrier foil is attached according to an embodiment of the present invention includes a carrier foil, a peeling layer, and an ultra-thin copper foil, wherein the peeling layer includes a first metal A having peelability, and a second metal B and a third metal C facilitating coating of the first metal, wherein the amount (a) of the first metal A is in a range of about 30 to about 89% by total weight of the peeling layer, the amount (b) of the second metal B is in a range of about 10 to about 60% by total weight of the peeling layer, and the amount (c) of the third metal C is in a range of about 1 to about 20% by total weight of the peeling layer. The peeling layer may be a layer formed of an alloy of the first metal, the second metal, and the third metal.

The second metal and the third metal are adsorbed onto a surface of the carrier foil and function as a catalyst for plating the first metal. In the ultra-thin copper foil to which a carrier foil is attached, an occurrence of blister is suppressed even at high temperature, and the ultra-thin copper foil can be easily peeled off from the carrier foil. If a single metal is used as the metal functioning as a catalyst for plating the first metal, uniformity of the peeling layer may be reduced.

The amounts a, b and c of the first through third metals A, B and C may be obtained by dividing the amount of the first metal A attached to 1 $dm^2$ of the peeling layer by the sum of the amount of the first metal A, the second metal B, and the third metal C attached to the same area of the peeling layer and multiplying the resultant by 100.

If the amounts (a) and (b) of the first metal A and second metal B are not within the ranges described above, peelability of the ultra-thin copper foil may be reduced. If the amount (c) of the third metal C is not within the range described above, the peeling layer may be non-uniformly plated.

The first metal A may be Mo or W, and the second metal B and the third metal C may be each independently one selected from a group consisting of Fe, Co, and Ni, wherein the second metal and the third metal are different from each other. The first metal A may be Mo, the second metal B may be Ni, and the third metal C may be Fe.

If the peeling layer is formed of the first metal A and the second metal B only, peeling properties of the peeling layer may not be uniform. Furthermore, the peeling layer may also be peeled off with the ultra-thin copper foil.

Since the peeling properties of the peeling layer are not uniform when the peeling layer is formed of the first metal A and the second metal B only (for example, Mo—Ni alloy layer), Fe, as a third metal C, which functions as a catalyst for plating Mo, is further added thereto in order to increase the amount of plated Mo which mainly causes peelability of the peeling layer. Due to the addition of Fe, the peeling layer may be uniformly plated.

The amount of the peeling layer formed on the carrier foil may be in a range of about 0.05 to about 10 $mg/dm^2$. If the amount of the peeling layer is less than 0.05 $mg/dm^2$, the peeling layer may not sufficiently function. On the other hand, if the amount of the peeling layer is greater than 10 $mg/dm^2$, the peeling layer may not be peeled since a peeling layer becomes not a peelable oxidant material but an unpeelable is metallic material. A surface roughness (Rz) of the peeling layer may be 1.5 times less than that of the carrier foil. A surface area of the peeling layer may be 1.5 times less than that of the carrier foil. When the surface roughness and the surface area are increased, peeling strength and variation may be increased.

The ultra-thin copper foil may be formed on the peeling layer by electrolytic plating using an electrolytic bath such as copper sulfate, copper pyrophosphorate, copper cyanide, copper sulfamate, or the like. In addition, a copper plating bath, i.e., the electrolytic bath, may have a pH of 1 to 12.

If the surface of the peeling layer is formed of a metal, which is easily melted in the plating solution, such as Cu, the surface state of the peeling layer is influenced by the immersion time in the plating solution, current value in the plating solution, the removal of the plating solution, washing, and pH of the plating solution after the plating. Thus, the type of the plating bath may be selected in consideration of the relationship between the surface of the peeling layer and the metal formed thereon.

In addition, a large number of pinholes may be formed in the ultra-thin copper foil since it is difficult to uniformly plate the ultra-thin copper foil on the peeling layer due to peelability of the peeling layer. If the plating is difficult, a strike copper plating process may be performed first, and then an electrolytic plating process may be performed. By performing the strike copper plating process, an ultra-thin copper foil may be uniformly formed on the peeling layer, thereby significantly reducing the number of pinholes on the ultra-thin copper foil.

The thickness of the copper layer formed using the strike copper plating process may be in a range of about 0.001 to about 1 μm. The current density of the copper layer may be in a range of about 0.1 to about 20 $A/dm^2$, and the plating time may be in a range of about 0.1 to about 300 seconds even though the conditions may vary according to the type of the plating bath. The plating may not be uniformly performed if the current density is less than 0.1 $A/dm^2$. If the current density is greater than 20 $A/dm^2$, a metal oxide is plated, i.e., burning occurs, since the current density exceeds allowed current density limit on the strike plating in which the concentration of the metal of the plating solution is diluted. Thus, it is difficult to obtain uniform copper foil layers. If the plating is performed for less than 0.1 seconds, the plated layer may not be sufficiently formed. If the plating is performed for greater than 300 seconds, productivity may be reduced.

A copper plating layer having a thickness of equal to or greater than 0.001 μm which does not reduce peelability of the peeling layer is formed on the peeling layer using the strike plating process, and then copper electrolytic plating is performed to a predetermined thickness to form an ultra-thin copper foil. The thickness of the ultra-thin copper foil may be in a range of about 1 to about 5 μm. The ultra-thin copper foil may have a roughened surface or an unroughened surface according to its use. The roughened surface may be formed using nodulation, and the unroughened surface may be formed by adding a brightener and a restrainer during the formation of the ultra-thin copper foil.

In addition, a surface of the ultra-thin copper foil (surface contacting the resin) may be subjected to a surface treatment in order to adjust adhesion between the metal foil and an insulating resin to a practical level or higher level. The surface treatment may be a thermal and chemical resistant treatment, a chromate treatment, or a silane coupling treatment, or a combination thereof. The surface treatment may be selected according to the insulating resin used.

The thermal and chemical resistant treatment may be performed by forming a thin layer of Ni, Sn, Zn, Cr, Mo, and Co, or an alloy thereof on the ultra-thin copper foil by sputtering, electroplating, or electroless plating. In this regard, electroplating may be the most economic method. A complexing agent such as citric acid, tartaric acid, and sulfamic acid may be added in order to facilitate precipitation of metal ions.

The chromate treatment may be performed using a solution including hexavalent chromium ions. The chromate treatment may be performed through a simple immersion. The chromate treatment may also be performed through a cathodic treatment. The conditions may be as follows: sodium dichromate: 0.1 to 50 g/L, pH: 1 to 13, temperature: 15 to 60° C., current density: 0.1 to 5 A/dm$^2$, and electrolysis time 0.1 to 100 seconds. Chromic acid or potassium dichromate may be used instead of the sodium dichromate. In addition, the chromate treatment may be performed with an anti-corrosive treatment, thereby improving moisture and thermal resistance.

A silane coupling agent used for the silane coupling treatment may be: epoxy functional silane such as 3-glycidoxypropyl trimethoxy silane and 2-(3,4-epoxycyclohexyl)ethyltrimethoxy silane; amino functional silane such as 3-aminopropyl trimethoxy silane, N-2-(aminoethyl)-3-aminopropyl trimethoxy silane, and N-2-(aminoethyl)-3-aminopropylmethyl dimethoxy silane; olefin functional silane such as vinyltrimethoxy silane, vinylphenyltrimethoxy silane, and vinyltris(2-methoxyethoxy)silane; acryl functional silane such as 3-acryloxypropyl trimethoxy silane; methacryl functional silane such as 3-methacryloxy propyl trimethoxy silane; or mercapto functional silane such as 3-mercaptopropyltrimethoxy silane. These compounds may be used alone or in combination. The silane coupling agent may be dissolved in a solvent such as water to a concentration of 0.1 to 15 g/L, and coated on a metal foil at a temperature ranging from room temperature to 50° C., or adsorbed on the metal foil by electrodeposition. The silane coupling agent is bonded to a hydroxyl group of metal used in an anti-corrosive treatment on the surface of the ultra-thin copper foil through condensation bonding to form a film. After the silane coupling treatment, stable bonds are formed by heat treatment, UV radiation, or the like. The heat treatment may be performed at a temperature of 100 to 200° C. for 2 to 60 seconds. The UV radiation may have a wavelength of 200 to 400 nm at 200 to 2500 mJ/cm$^2$. In addition, the silane coupling treatment may be applied to the outermost layer of the ultra-thin copper foil, thereby improving moisture resistance and adhesion between the insulating resin layer and a metal foil.

A printed circuit board according to an embodiment of the present invention may be prepared by stacking the ultra-thin copper foil to the which carrier foil is attached on a resin board, wherein the ultra-thin copper foil faces the resin board. The printed circuit board may be a printed circuit board for high-density micro patterns, multilayered printed circuit board, chip-on-film printed circuit board, and flexible printed circuit board.

A method of preparing an ultra-thin copper foil to which a carrier foil is attached according to an embodiment of the present invention may include forming a peeling layer on a smooth surface of a carrier copper foil in a plating bath having a pH equal to or greater than 9.5 and including a first metal, a second metal, a third metal, a metal salt of citric acid, and ammonia water or an ammonium salt. The first metal may be Mo or W, and the second metal and the third metal may be each independently one selected from a group consisting of Fe, Co, and Ni, wherein the second metal and the third metal are different from each other. The first metal may be Mo, the second metal may be Ni, and the third metal may be Fe.

The concentration of the first metal may be in a range of about 1 to about 100 g/L, the concentration of the second metal may be in a range of about 1 to about 40 g/L, and the concentration of the third metal may be in a range of about 0.1 to about 20 g/L.

The metal salt of citric acid turns into citrate ions when added to the plating bath. The metal salt of citric acid may be potassium citrate, sodium citrate, ferric citrate, calcium citrate, trisodium citrate, or ferric ammonium citrate, or any mixture thereof. The citrate ions may enable the first metal to be plated with a metal oxide and reduce voltage of the plating bath. For example, if citrate ions react with Ni in a plating bath including Mo, Ni, and Fe to form a Ni-citrate complex, $MoO_4^{2-}$ easily forms a peeling layer in the form of $MoO_2$. The concentration of the metal salt of citric acid included in the plating bath may be in a range of about 5 to about 200 g/L, for example, about 15 to about 150 g/L.

The pH of the plating bath may be equal to or greater than 9.5. If the pH of the plating bath is less than 9.5, the peeling layer may not be easily formed. Ammonia water or an ammonium salt may be added in order to control the pH of the plating bath. The amount of the ammonia water or the ammonium salt may be in a range of about 0.001 to about 0.5 N.

According to one embodiment of the method of preparing an ultra-thin copper foil to which a carrier foil is attached, in the plating bath, the concentration of the first metal may be in a range of about 1 to about 100 g/L, the concentration of the second metal may be in a range of about 1 to about 40 g/L, the concentration of the third metal may be in a range of about 0.1 to about 20 g/L, the concentration of the metal salt of citric acid may be in a range of about 5 to about 200 g/L, and the concentration of the ammonia water or ammonium salt may be in a range of about 0.001 to about 1 N.

The method of preparing the ultra-thin copper foil to which a carrier foil is attached is described as follows. An electrolytic copper foil having a predetermined surface roughness and thickness is subjected to an acidic treatment using a strong acid such as sulfuric acid and the resultant is washed with pure water to prepare a carrier copper foil. The carrier copper foil is immersed in a plating bath having a pH equal to or greater than 9.5 and including a first metal, a second metal, a third metal, a metal salt of citric acid, and ammonia water or an ammonium salt to form a peeling layer on a smooth surface of the carrier copper foil. Then, a copper foil layer is formed on the peeling layer by strike plating and an ultra-thin copper foil is formed by electrolytic plating. Conditions for preparing the carrier copper foil, forming a copper foil layer by a strike plating, and forming an ultra-thin copper foil may be controlled if desired.

Hereinafter, the present invention is described in more detail by referring to examples. However, it will be apparent to those of ordinary skill in the art that these examples provided below are for illustrative purposes only and are not intended to limit the scope of the invention.

Preparation of Ultra-Thin Copper Foil to which Carrier Foil is Attached

EXAMPLE 1

1. Preparation of Carrier Foil
An electrolytic copper foil having a surface roughness (Rz) of 1.5 μm or less and a thickness of 35 μm was immersed in 100 g/L of sulfuric acid for 5 seconds, and washed with pure water.

2. Formation of Peeling Layer
A copper foil was subjected to a Mo—Ni—Fe plating in a plating bath under the conditions below to form a peeling layer.
Mo amount: 20 g/L, Ni amount: 6.5 g/L, Fe amount: 3 g/L
sodium citrate: 150 g/L pH 10.31 (ammonia water (30 mL/L))
temperature of plating bath: 25° C.
current density: 10 A/dm$^2$
plating time: 7 seconds The amount of the formed peeling layer was 1.07 mg/dm$^2$, and composition of the peeling layer was as follows: Mo: 62.56% by weight, Ni: 30.81% by weight, Fe: 6.63% by weight.

3. Formation of Strike Plating Layer

A strike plating layer was formed under the conditions below using a pyrophosphoric acid copper strike plating bath or cyanide copper strike plating bath.
temperature of plating bath: 25° C.
current density: 5 A/dm$^2$
plating time: 7 seconds
composition of pyrophosphoric acid copper strike plating bath
$K_4P_2O_7$: 125 g/L, $Cu_2P_2O_7$ $4H_2O$: 25 g/L
$KNO_3$: 2 g/L, pH 8
composition of cyanide copper strike plating bath
CuCN $5H_2O$: 30 g/L, KCN: 60 g/L, pH 12

4. Formation of Ultra-Thin Copper Foil

An ultra-thin copper foil was formed in a plating bath under the conditions below.
$CuSO_4$ $5H_2O$: 350 g/L, $H_2SO_4$: 150 g/L
temperature of plating bath: 60° C.
current density: 10 A/dm$^2$
plating time: 7 seconds

EXAMPLE 2

Experiments were performed in the same manner as in Example 1, except that the composition of the plating bath used to form the peeling layer was changed as follows.

2. Formation of Peeling Layer
Mo amount: 20 g/L, Ni amount: 6.5 g/L, Fe amount: 3 g/L
sodium citrate: 90 g/L
pH 10.28 (ammonia water (30 mL/L))
temperature of plating bath: 25° C.
current density: 10 A/dm$^2$
plating time: 7 seconds The amount of the formed peeling layer was 1.63 mg/dm$^2$, and the composition of the peeling layer was as follows: Mo: 51.57% by weight, Ni: 45.05% by weight, Fe: 3.38% by weight.

EXAMPLE 3

Experiments were performed in the same manner as in Example 1, except that the composition of the plating bath used to form the peeling layer was changed as follows.

2. Formation of Peeling Layer
Mo amount: 20 g/L, Ni amount: 6.5 g/L, Fe amount: 4 g/L
sodium citrate: 150 g/L
pH 10.21 (ammonia water (28 mL/L))
temperature of plating bath: 25° C.
current density: 10 A/dm$^2$
plating time: 7 seconds The amount of the formed peeling layer was 1.17 mg/dm$^2$, and the composition of the peeling layer was as follows: Mo: 67.52% by weight, Ni: 25.64% by weight, Fe: 6.84% by weight.

EXAMPLE 4

Experiments were performed in the same manner as in Example 1, except that the composition of the plating bath used to form the peeling layer was changed as follows.

2. Formation of Peeling Layer
Mo amount: 4 g/L, Ni amount: 1.3 g/L, Fe amount: 0.6 g/L
sodium citrate: 90 g/L
pH 10.28 (ammonia water (4 mL/L))
temperature of plating bath: 25° C.
current density: 10 A/dm$^2$
plating time: 7 seconds The amount of the formed peeling layer was 0.20 mg/dm$^2$, and the composition of the peeling layer was as follows: Mo: 78.82% by weight, Ni: 12.81% by weight, Fe: 8.37% by weight.

EXAMPLE 5

Experiments were performed in the same manner as in Example 1, except that the composition of the plating bath used to form the peeling layer was changed as follows.

2. Formation of Peeling Layer
Mo amount: 20 g/L, Ni amount: 9.6 g/L, Fe amount: 3 g/L
sodium citrate: 150 g/L
pH 10.16 (ammonia water (26 mL/L))
temperature of plating bath: 25° C.
current density: 10 A/dm$^2$
plating time: 7 seconds The amount of the formed peeling layer was 2.39 mg/dm$^2$, and the composition of the peeling layer was as follows: Mo: 43.91% by weight, Ni: 52.70% by weight, Fe: 3.39% by weight.

EXAMPLE 6

Experiments were performed in the same manner as in Example 1, except that the composition of the plating bath used to form the peeling layer was changed as follows.

2. Formation of Peeling Layer
Mo amount: 50 g/L, Ni amount: 15 g/L, Fe amount: 3 g/L
sodium citrate: 150 g/L
pH 10.3 (ammonia water (2 mL/L))
temperature of plating bath: 25° C.
current density: 10 A/dm$^2$
plating time: 7 seconds The amount of the formed peeling layer was 2.64 mg/dm$^2$, and the composition of the peeling layer was as follows: Mo: 41.67% by weight, Ni: 56.82% by weight, Fe: 1.51% by weight.

EXAMPLE 7

Experiments were performed in the same manner as in Example 1, except that the composition of the plating bath used to form the peeling layer was changed as follows.

2. Formation of Peeling Layer
Mo amount: 80 g/L, Ni amount: 25 g/L, Fe amount: 3 g/L
sodium citrate: 200 g/L
pH 10.45 (ammonia water (1 mL/L))
temperature of plating bath: 25° C.
current density: 10 A/dm$^2$
plating time: 7 seconds The amount of the formed peeling layer was 3.06 mg/dm$^2$, and the composition of the peeling layer was as follows: Mo: 40.59% by weight, Ni: 58.27% by weight, Fe: 1.14% by weight.

COMPARATIVE EXAMPLE 1

1. Preparation of Carrier Foil

An electrolytic copper foil having a surface roughness (Rz) of 2 μm or less and a thickness of 35 μm was immersed in 100 g/L of sulfuric acid for 5 seconds, and washed with pure water.

2. Formation of Peeling Layer

A carrier copper foil was subjected to a Cr electroplating process to form a peeling layer.

3. Formation of Ultra-Thin Copper Foil

An ultra-thin copper foil was formed in a plating bath to a thickness of 1 μm under the conditions below.
  $Cu_2P_2O_7\ 3H_2O$: 30 g/L
  $K_4P_2O_7$: 300 g/L
  pH 8
  current density: 4 A/dm$^2$ Then, Cr was plated on the ultra-thin copper foil to a thickness of 3 μm under the conditions below and a roughening process was performed to attach copper particles thereto.
  Cu concentration: 50 g/L
  $H_2SO_4$: 100 g/L
  current density: 20 A/dm$^2$ The roughened ultra-thin copper layer was subjected to zinc and chromate treatments using a conventional method, as an anti-corrosive and surface treatment, to form an ultra-thin copper foil to which a carrier foil is attached.

COMPARATIVE EXAMPLE 2

Experiments were performed in the same manner as in Example 1, except that the composition of the plating bath used to form the peeling layer was changed as follows.

2. Formation of Peeling Layer
  Mo amount: 4 g/L, Ni amount: 1.3 g/L
  sodium citrate: 90 g/L
  temperature of plating bath: 25° C.
  current density: 10 A/dm$^2$
  plating time: 7 seconds The amount of the formed peeling layer was 0.1 mg/dm$^2$, and the composition of the peeling layer was as follows: Mo: 53% by weight, Ni: 47% by weight.

COMPARATIVE EXAMPLE 3

Experiments were performed in the same manner as in Example 1, except that the composition of the plating bath used to form the peeling layer was changed as follows.

2. Formation of Peeling Layer
  Mo amount: 0.09 g/L, Ni amount: 2.88 g/L
  sodium citrate: 90 g/L
  temperature of plating bath: 25° C.
  current density: 10 A/dm$^2$
  plating time: 7 seconds The amount of the formed peeling layer was 0.07 mg/dm$^2$, and the composition of the peeling layer was as follows: Mo: 55% by weight, Ni: 45% by weight.

COMPARATIVE EXAMPLE 4

Experiments were performed in the same manner as in Example 1, except that the composition of the plating bath used to form the peeling layer was changed as follows.

2. Formation of Peeling Layer
  Mo amount: 20 g/L, Ni amount: 6.5 g/L, Fe amount: 3 g/L
  sodium citrate: 150 g/L
  pH 8.5 (($NH_4)_2SO_4$ (15 g/L))
  temperature of plating bath: 25° C.
  current density: 10 A/dm$^2$
  plating time: 7 seconds The amount of the formed peeling layer was 0.70 mg/dm$^2$, and the composition of the peeling layer was as follows: Mo: 23.27% by weight, Ni: 76.62% by weight, Fe: 0.11% by weight.

COMPARATIVE EXAMPLE 5

Experiments were performed in the same manner as in Example 1, except that the composition of the plating bath used to form the peeling layer was changed as follows.

2. Formation of Peeling Layer
  Mo amount: 0.5 g/L, Ni amount: 6.5 g/L, Fe amount: 3 g/L
  sodium citrate: 150 g/L
  pH 10.3 (ammonia water (30 ml/L))
  temperature of plating bath: 25° C.
  current density: 10 A/dm$^2$
  plating time: 7 seconds The amount of the formed peeling layer was 0.72 mg/dm$^2$, and the composition of the peeling layer was as follows: Mo: 23.61% by weight, Ni; 55.56% by weight, Fe: 20.93% by weight.

COMPARATIVE EXAMPLE 6

Experiments were performed in the same manner as in Example 1, except that the composition of the plating bath used to form the peeling layer was changed as follows.

2. Formation of Peeling Layer
  Mo amount: 20 g/L, Ni amount: 6.5 g/L, Fe amount: 3 g/L
  sodium citrate: 150 g/L
  pH 8.9 (ammonia water (3 mL/L))
  temperature of plating bath: 25° C.
  current density: 10 A/dm$^2$
  plating time: 7 seconds

COMPARATIVE EXAMPLE 7

Experiments were performed in the same manner as in Example 1, except that the composition of the plating bath used to form the peeling layer was changed as follows.

2. Formation of Peeling Layer
  Mo amount: 20 g/L, Ni amount: 6.5 g/L, and Fe amount: 3 g/L
  sodium citrate: 150 g/L
  pH 9 (ammonia water (15 mL/L))
  temperature of plating bath: 25° C.
  current density: 10 A/dm$^2$
  plating time: 7 seconds

COMPARATIVE EXAMPLE 8

Experiments were performed in the same manner as in Example 1, except that the composition of the plating bath used to form the peeling layer was changed as follows.

2. Formation of Peeling Layer
  Mo amount: 20 g/L, Ni amount: 6.5 g/L, Fe amount: 3 g/L
  sodium citrate: 150 g/L
  pH 10.9 (NaOH (6 g/L))
  temperature of plating bath: 25° C.
  current density: 10 A/dm$^2$
  plating time: 7 seconds

EVALUATION EXAMPLE 1

Evaluation of Properties of Ultra-Thin Copper Foil

The ultra-thin copper foils to which a carrier foil was attached (Examples 1 to 7, and Comparative Examples 1 to 8) were cut into pieces of 200 mm×200 mm in size. Polyimide varnish was coated thereon and dried at temperatures of 40° C. for 30 minutes, 60° C. for 30 minutes, 80° C. for 30 minutes, 150° C. for 30 minutes, 200° C. for 30 minutes, and 350° C. so as to prevent the generation of bubbles. The resultants were heat treated at 350° C. for 10 minutes under a nitrogen atmosphere to prepare samples for evaluating blister. The sample ultra-thin copper foils were observed with the naked eye in order to determine whether the samples had expanded, and then the number of blister was counted. The results are shown in Table 1 below.

Then, a resin board was attached to the ultra-thin copper foil side of the heat treated samples respectively to prepare single-sided copper-clad laminates, i.e., carrier foil attached polyimide for measuring carrier peel of the foil. A sample was cut from the copper-clad laminates. Then, the ultra-thin copper foils were peeled off from the carrier foils with a measured specimen width of 10 mm according to the method prescribed in JIS C6511 and peeling strength (carrier peel) for n=3 was measured. The results of the evaluation are shown in Table 1 below.

In Table 1, X indicates that the peeling layer is not delaminated from the ultra thin copper foil but the ultra-thin copper foil itself is delaminated from the resin board.

TABLE 1

|  | Number of delamination | Carrier peel [KN/m] |
|---|---|---|
| Example 1 | 0 | 0.030 |
| Example 2 | 0 | 0.040 |
| Example 3 | 0 | 0.050 |
| Example 4 | 1 | 0.055 |
| Example 5 | 1 | 0.050 |
| Example 6 | 0 | 0.060 |
| Example 7 | 1 | 0.045 |
| Comparative Example 1 | 1 | X |
| Comparative Example 2 | 0 | X |
| Comparative Example 3 | 1 | X |
| Comparative Example 4 | 0 | X |
| Comparative Example 5 | 1 | X |
| Comparative Example 6 | — | — |
| Comparative Example 7 | — | — |
| Comparative Example 8 | — | — |

As shown in Table 1, the number of blasters of the samples comprising the peeling layers including three metals having a predetermined composition prepared according to Examples 1 to 7 was similar to that of the samples according to Comparative Examples 1 to 5. However, the carrier peel of Examples 1 to 7 was significantly reduced in comparison with that of Comparative Examples 1 to 5. Peeling layers were not formed in Comparative Examples 6 to 8.

It should be understood that the exemplary embodiments described therein should be considered in a descriptive sense only and not for purposes of limitation. Descriptions of features or aspects within each embodiment should typically be considered as available for other similar features or aspects in other embodiments.

The invention claimed is:

1. An ultra-thin copper foil to which a carrier foil is attached, comprising: a carrier foil, a peeling layer, and an ultra-thin copper foil, wherein the peeling layer comprises a first metal A having peelability, and a second metal B and a third metal C facilitating coating of the first metal, wherein the amount (a) of the first metal A is in a range of about 30 to about 89% by total weight of the peeling layer, the amount (b) of the second metal B is in a range of about 10 to about 60% by total weight of the peeling layer, and the amount (c) of the third metal C is in a range of about 1 to about 20% by total weight of the peeling layer, wherein the second metal B and the third metal C are different from each other, wherein the first metal comprises Mo or W, and the second metal and the third metal are each independently one selected from a group consisting of Fe, Co, and Ni, wherein the second metal and the third metal are different from each other.

2. The ultra-thin copper foil to which a carrier foil is attached of claim 1, wherein the first metal comprises Mo, the second metal comprises Ni, and the third metal comprises Fe.

3. A printed circuit board prepared by stacking the ultra-thin copper foil to which a carrier foil is attached of claim 2 on a resin board, wherein the ultra-thin copper foil faces the resin board.

4. The ultra-thin copper foil to which a carrier foil is attached of claim 1, wherein the coated amount of the peeling layer is in a range of about 0.05 to about 10 mg/dm2.

5. A printed circuit board prepared by stacking the ultra-thin copper foil to which a carrier foil is attached of claim 4 on a resin board, wherein the ultra-thin copper foil faces the resin board.

6. A printed circuit board prepared by stacking the ultra-thin copper foil to which a carrier foil is attached of claim 1 on a resin board, wherein the ultra-thin copper foil faces the resin board.

7. A printed circuit board prepared by stacking the ultra-thin copper foil to which a carrier foil is attached of claim 1 on a resin board, wherein the ultra-thin copper foil faces the resin board.

* * * * *